United States Patent
Ushiki et al.

(10) Patent No.: US 6,743,698 B2
(45) Date of Patent: Jun. 1, 2004

(54) SEMICONDUCTOR WAFER, METHOD FOR PRODUCING THE SAME, AND WAFER CHUCK

(75) Inventors: Takehito Ushiki, Fukushima-ken (JP); Hitoshi Tsunoda, Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/016,008

(22) Filed: Dec. 11, 2001

(65) Prior Publication Data

US 2002/0081417 A1 Jun. 27, 2002

Related U.S. Application Data

(62) Division of application No. 09/346,004, filed on Jul. 1, 1999, now abandoned.

(30) Foreign Application Priority Data

Jul. 8, 1998 (JP) .......................................... 10-208633

(51) Int. Cl.[7] ........................ H01L 21/46; H01L 21/302
(52) U.S. Cl. ........................ 438/460; 438/690; 438/691
(58) Field of Search .............................. 438/690, 691, 438/692, 693

(56) References Cited

U.S. PATENT DOCUMENTS

| | | | | |
|---|---|---|---|---|
| 5,306,942 A | * | 4/1994 | Fujii | 257/508 |
| 5,447,890 A | | 9/1995 | Kato et al. | 437/249 |
| 5,899,744 A | * | 5/1999 | Toyama et al. | 438/690 |
| 5,904,568 A | * | 5/1999 | Maeda et al. | 438/690 |
| 6,146,913 A | * | 11/2000 | Rafferty | 438/16 |
| 6,204,922 B1 | * | 3/2001 | Chalmers | 356/381 |

FOREIGN PATENT DOCUMENTS

| | | |
|---|---|---|
| EP | 0337556 | 10/1989 |
| EP | 0764976 | 3/1997 |
| EP | 0782179 | 7/1997 |
| JP | 06-114664 | 4/1994 |
| WO | WO 8912318 | 12/1989 |

OTHER PUBLICATIONS

Current Status of 200 mm and 300 mm Silicon Wafers; Howard R. Huff et al.; 1998 Publication Board, Japanese Journal of Applied Physics; vol. 37, part 1, No. 3B Mar. 1998; pp 1210–1216.

Thickness Considerations in Direct Silicon Wafer Bonding; Q.Y. Tong et al., J. Electrochem. Soc., vol. 142, No. 11; Nov. 1995.

* cited by examiner

*Primary Examiner*—Nadine G. Norton
*Assistant Examiner*—Duy-Vu Deo
(74) *Attorney, Agent, or Firm*—Hogan & Hartson, L.L.P.

(57) ABSTRACT

There are disclosed a semiconductor wafer which has undulation components on wafer back surface and/or wafer front surface of 10 $\mu m^3$ or less represented in terms of power spectrum density at least for the components at a wavelength of 10 mm; method for producing a semiconductor wafer by polishing front surface of the semiconductor wafer which is held at its back surface, which utilizes a semiconductor wafer to be polished having undulation components on wafer back surface of 10 $\mu m^3$ or less represented in terms of power spectrum density at least for the components at a wavelength of 10 mm; and wafer chuck provided with a holding surface for holding a wafer by chucking, wherein the holding surface has undulation components of 10 $\mu m^3$ or less represented in terms of power spectrum density at least for the components at a wavelength of 10 mm. According to the present invention, undulation components of semiconductor wafers can be quantitatively evaluated, and thereby there can be provided a semiconductor wafer free from surface undulation components, a method for producing such a semiconductor wafer, and a wafer chuck therefor. Such undulation components may cause problems upon lithography, device separation and the like in the device-processing steps.

4 Claims, 5 Drawing Sheets

(A)

(E)

(D)

(C)

(B)

SEMICONDUCTOR WAFER, METHOD FOR PRODUCING THE SAME, AND WAFER CHUCK

This is a divisional of application Ser. No. 09/346,004 filed Jul. 1, 1999 now abandoned, which application is hereby incorporated by reference in its entirety.

BACKGROUND OF THE INVENTION

1. Field of the Invention

The present invention relates to a semiconductor wafer having few undulation components, which components may cause problems especially in device-processing steps, and a method for producing such a semiconductor wafer.

2. Description of Related Art

With recent use of higher integration degree of semiconductor devices, requirement for flatness of semiconductor wafer surface to be used has also become increasingly severer. In particular, when a semiconductor wafer is chucked on a wafer chuck, while warpage of the wafer may be corrected, irregularities present on the back surface of the wafer may be transferred to the front surface to deteriorate flatness of the front surface. Further, if such a wafer chuck has irregularities on its holding surface, such irregularities may also be transferred to the wafer front surface, and deteriorate production yield in the device-processing steps. Therefore, in order to improve the flatness of semiconductor wafers, flatness of their back surfaces and the wafer chuck surface must be improved in addition to flatness of the wafer front surfaces.

Conventional methods for producing semiconductor wafers generally comprise, as shown in FIG. 4 as a block diagram of process steps, a slicing step (A) to obtain a wafer of thin disc shape by slicing a single crystal ingot grown in a crystal pulling apparatus by means of a wire saw, inner diameter slicer or the like; a chamfering-step (B) to chamfer a peripheral edge portion of the wafer obtained through the slicing step (A) to prevent cracking or breakage of the wafer; a lapping step (C) to flatten the surface of the chamfered wafer by lapping it; an etching step (D) to remove mechanical damages of the chamfered and lapped wafer; a mirror polishing step (E) to finish the etched wafers to have a mirror polished surface by polishing so that surface roughness and flatness of the wafer should be improved; and a cleaning step (F) to clean the mirror polished wafer to remove the polishing agent or dust particles from the wafer.

Wafers to be polished in such a method as mentioned above usually have irregularities generated in the etching step on their front surfaces or back surfaces. When such a wafer is held at its one side (back surface) by chucking (vacuum chucking) and the other side (front surface) is polished, the surface to be polished would have irregularities reflecting the irregularities of the back surface, and polishing should be done for such a surface. Therefore, while a flat surface of the wafer with no irregularities may be obtained when the polishing is completed and the wafer is still held by chucking, the front surface would have irregularities transferred from the back surface when the wafer is released from the holding. Thus, the irregularities of wafer back surface are transferred to the front surface, which invites various problems in the device-processing steps as described above.

These phenomena have been understood in their nature, but it has not been elucidated at all what kind of irregularities of wafer back surface or holding front surface of wafer chuck are actually transferred to the front surface and cause problems.

As for the flatness of semiconductor wafers, while there have not been any definite definitions or specifications, the following three kinds of components, i.e., periodic irregularities having a wavelength of about 20 mm or more called warpage, irregularities having a wavelength of around several mm to 20 mm called undulations (waviness), irregularities having a wavelength of about 100 μm or less called microroughness, have conventionally been considered important. In particular, the components called undulations have been understood as images obtained by the principle of magic mirror, and they have been confirmed only externally, and thus could not be evaluated quantitatively.

In addition, the photolithography techniques used in the recent device-processing steps have shifted from those utilizing entire surface light exposure to those utilizing partial light exposure (stepper method), and therefore the flatness concerning the undulation components has become more important. Moreover, considering the current situation that STI (Shallow Trench Isolation) has become to be widely used as a device isolation technique in the device-processing steps, planarization by CMP (Chemical Mechanical Polishing) is important to form STI, and hence it is necessary to eliminate the undulation components in order to surely isolate devices by obtaining uniform polishing stock removal.

SUMMARY OF THE INVENTION

The present invention has been accomplished to solve the aforementioned problems, and its object is to quantitatively evaluate the undulation components of semiconductor wafers, thereby providing a semiconductor wafer free from the undulation components. Such undulation components may be, if present, transferred from the wafer back surface to the front surface to cause problems upon photolithography in the device-processing step, device isolation and the like as described above. Another object of the present invention is to provide a method for producing such a semiconductor wafer, and a wafer chuck therefor.

To achieve the aforementioned object, the present invention provides a semiconductor wafer characterized in that it has undulation components on wafer back surface of 10 $\mu m^3$ or less represented in terms of power spectrum density at least for the components at a wavelength of 10 mm.

According to the present invention, front surface and back surface profiles of semiconductor wafers are determined before and after the wafer holding by vacuum suction, and the determined profiles are analyzed by frequency analysis to quantitatively evaluate the influence of the back surface profile on the front surface profile in relation to the spatial frequency. The characteristic of the aforementioned semiconductor wafer is defined based on such analysis and evaluation.

That is, if a semiconductor wafer has undulation components on its back surface of 10 $\mu m^3$ or less represented in terms of power spectrum density (PSD) at least for such components at a wavelength of 10 mm, the back surface profile of the wafer would not be transferred to the front surface to cause problems upon photolithography and the like, even when, for example, the wafer is held on a wafer chuck by chucking.

The present invention also provides a semiconductor wafer characterized in that it has undulation components on its wafer front surface of 10 $\mu m^3$ or less represented in terms of power spectrum density at least for the components at a wavelength of 10 mm.

Because the transfer of the back surface profile to the front surface is prevented according to the present invention, the wafer front surface can have a power spectrum density of 10 $\mu m^3$ or less as defined in the aforementioned wafer, for example, even when the wafer is held on a wafer chuck by chucking.

The present invention also provides a semiconductor wafer characterized in that it has undulation components on its wafer front surface and back surface of 10 $\mu m^3$ or less represented in terms of power spectrum density at least for the components at a wavelength of 10 mm.

According to the present invention, there can be provided such a wafer excellent in the flatness as defined above, which is free from the undulation components of the back surface, and therefore free from the undulation components of the front surface transferred from the back surface.

The present invention further provides a semiconductor wafer characterized in that it exhibits a variation of power spectrum density of 2.0 or less for undulation components at a wavelength of from 3 mm to 20 mm of wafer back surface and/or wafer front surface.

The term "variation of power spectrum density for undulation components at a wavelength of from 3 mm to 20 mm" herein used means a value calculated in accordance with the following equation: [log(PSD at wavelength of 20 mm)–log (PSD at wavelength of 3 mm)]. When this value is 2.0 or less, the back surface profile is not transferred to the front surface to cause problems during photolithography and the like.

Any of the aforementioned semiconductor wafers of the present invention preferably has the above characteristic, that is, a variation of power spectrum density of 2.0 or less for undulation components at a wavelength of from 3 mm to 20 mm of wafer back surface and/or wafer front surface.

When a semiconductor wafer has undulation components at a wavelength of 10 mm of 10 $\mu m^3$ or less represented in terms of power spectrum density, and a variation of power spectrum density of 2.0 or less for undulation components at a wavelength of from 3 mm to 20 mm, the transfer of back surface profile to the front surface is surely prevented in the semiconductor wafer.

The aforementioned semiconductor wafers of the present invention preferably show warpage of 20 $\mu m$ or less.

While the warpage component may be corrected when the wafer is held by chucking, a smaller warpage is more preferred because a smaller warpage makes the undulation component transfer more likely to be prevented when the wafer is held by the same chucking force. The expression "warpage of 20 $\mu m$ or less" herein used means that the degree of warpage for the whole wafer is 20 $\mu m$ or less.

The aforementioned semiconductor wafers of the present invention preferably have a mirror polished surface at least as their surfaces.

According to the present invention, the problem of the back surface undulation component transfer to the front surface, which is particularly disadvantageous when the wafer front surface is polished into a mirror polished surface, is eliminated.

The semiconductor wafers of the present invention are preferably silicon semiconductor wafers.

This is because the back surface undulation component transfer to the front surface, which causes problems upon photolithography, is particularly disadvantageous for silicon semiconductor devices, which utilize increasingly higher integration degrees.

The present invention further provides a wafer chuck provided with a holding surface for holding a wafer by chucking, characterized in that the holding surface has undulation components of 10 $\mu m^3$ or less represented in terms of power spectrum density at least for the components at a wavelength of 10 mm.

If a wafer has undulation components on its wafer back surface of 10 $\mu m^3$ or less represented in terms of power spectrum density at least for the components at a wavelength of 10 mm, the back surface profile is not transferred to the front surface even when the wafer is held on a wafer chuck by chucking, and hence does not cause any problem during photolithography and the like as explained above. However, even if the wafer itself does not have undulation components, if a wafer holding surface of wafer chuck has undulation components, such undulation components are eventually transferred to the front surface to cause similar problems when the wafer is held on the chuck. Therefore, the low degree of the undulation components for the holding surface of wafer chuck is also defined according in the present invention.

The present invention still further provides a method for producing a semiconductor wafer by polishing a front surface of the semiconductor wafer which is held at its back surface, characterized in that the method utilizes a semiconductor wafer to be polished having undulation components on its wafer back surface of 10 $\mu m^3$ or less represented in terms of power spectrum density at least for the components at a wavelength of 10 mm.

When one side (front surface) of a semiconductor wafer is polished while the wafer is held at the other side (back surface), a semiconductor wafer having a good surface profile can be produced by utilizing a semiconductor wafer to be polished having undulation components on its wafer back surface of 10 $\mu m^3$ or less represented in terms of power spectrum density at least for the components at a wavelength of 10 mm as defined above, because such a wafer is free from problematic undulation components on its back surface to be held, and hence undulations are not transferred to the front surface during the polishing.

According to the present invention, undulation components of semiconductor wafers can be quantitatively evaluated, and thereby there can be provided a semiconductor wafer free from surface undulation components, a method for producing such a semiconductor wafer, and a wafer chuck therefor. Such undulation components may cause problems upon lithography, device isolation and the like in the device-processing steps. In the semiconductor wafer of the present invention, in particular, undulation components of wafer back surface are not transferred to wafer front surface to cause problems.

DESCRIPTION OF THE INVENTION AND EMBODIMENTS

Embodiments of the present invention will be explained hereinafter for exemplary semiconductor wafers that are silicon wafers. However, the present invention is not limited to these.

As explained hereinbefore, when a semiconductor wafer is held on a wafer chuck or the like by chucking in device-processing steps or the like, or when a wafer is held at its back surface in order to polish its front surface in wafer production steps, irregularities of the back surface may be transferred to the front surface to degrade the surface flatness, or irregularities of holding surface of the wafer chuck may be transferred to the wafer front surface to cause similar problems.

Figure 3:
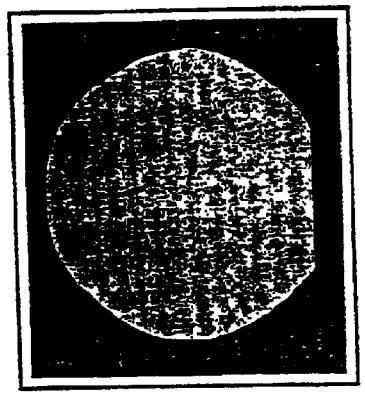
FIG. 3 represents magic mirror images of various semiconductor wafers: (A) magic mirror image of wafer front surface of conventional wafer (produced by acid etching) before it was held on a wafer chuck, (B) magic mirror image of wafer front surface of conventional wafer (produced by acid etching) after it was held on a wafer chuck, (C) magic mirror image of wafer front surface of wafer produced by alkali etching after it was held on a wafer chuck, (D) magic mirror image of wafer front surface of wafer produced by alkali etching and back surface polishing after it was held on a wafer chuck, and (E) magic mirror image of wafer front surface of wafer produced by acid etching and polishing of both surfaces after it was held on a wafer chuck.
Figure 3:
Figure 3:
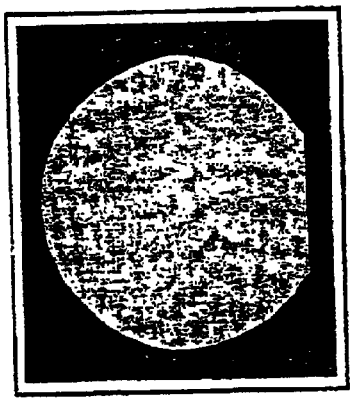
Figure 3:
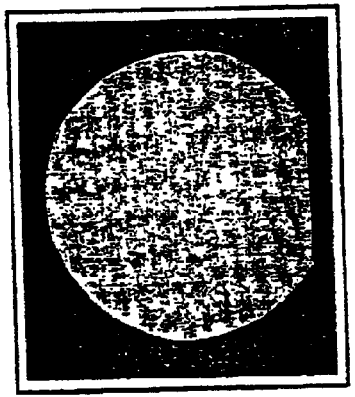
Figure 3:
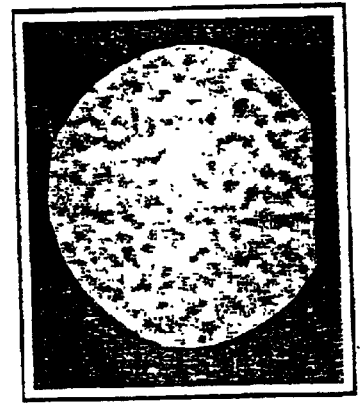

Those phenomena can be confirmed by observing images of silicon wafer front surfaces by a magic mirror (also referred to simply as "magic mirror images" hereinafter) as shown in FIGS. 3(A) and (B). FIG. 3(A) is a magic mirror image of wafer front surface before holding by chucking, and FIG. 3(B) is a magic mirror image of wafer front surface after holding by chucking. They clearly show change of surface profiles before and after the holding by chucking. However, the images only visually show such change, and do not enable quantitative evaluation of the change. Therefore, it has not been elucidated what kind of irregularities should be improved.

Therefore, the inventors of the present invention attempted to quantitatively evaluate the influence of back surface profile on front surface profile by determining profile changes of front surfaces and back surfaces of semiconductor wafers before and after holding by vacuum suction.

That is, front surface and back surface profiles of mirror polished wafers with differently finished back surfaces before and after holding by chucking were determined by using, for example, an optical profile analyzer, and the determined profiles were analyzed by frequency analysis (power spectrum analysis) to quantitatively evaluate the influence of back surface profiles on front surface profiles in relation to the spatial frequency.

Figure 1:
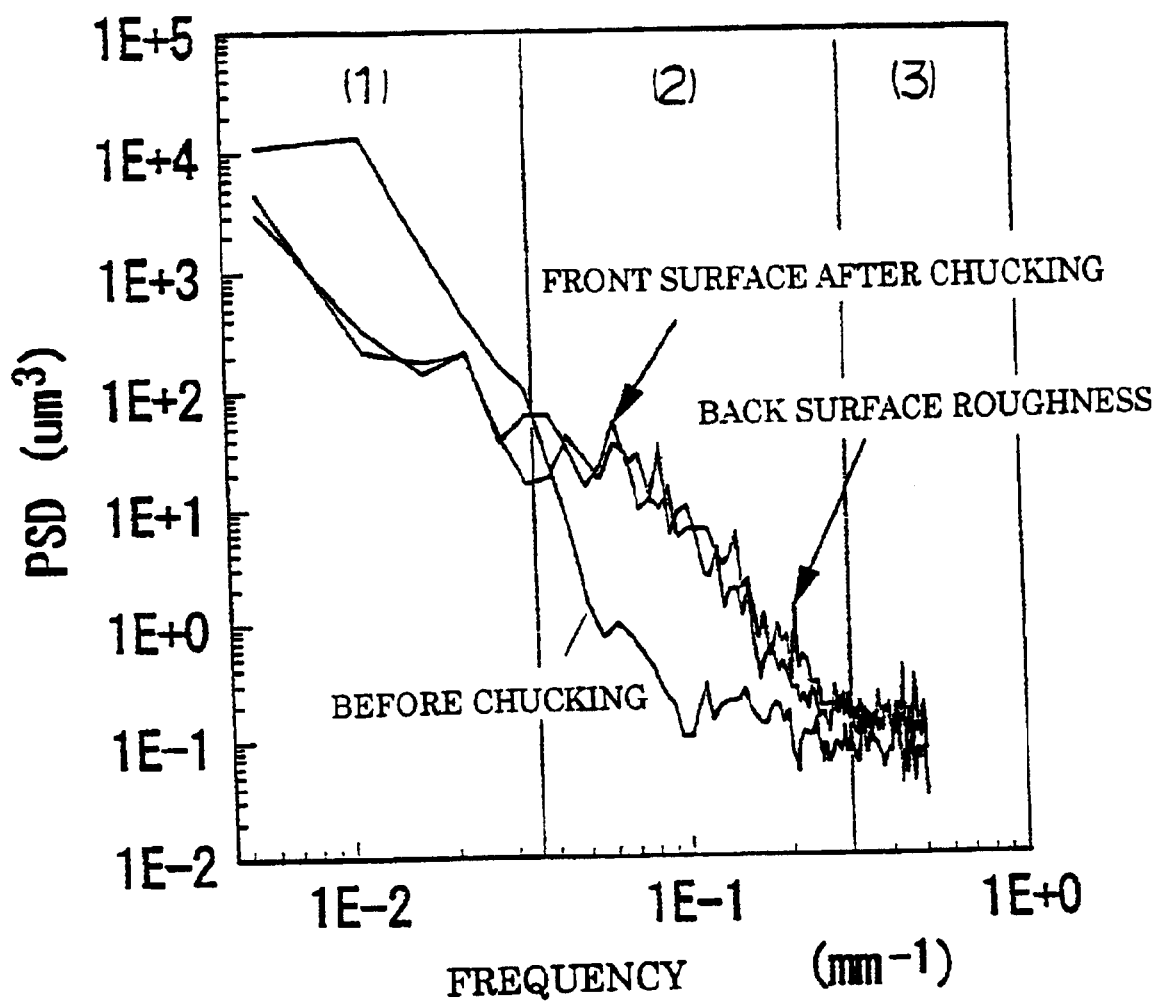
FIG. 1 represents results of power spectrum density analysis for typical front surface and back surface profiles of single side mirror polished silicon wafers.

FIG. 1 shows results of power spectrum analysis of typical front surface and back surface profiles of single side mirror polished silicon wafers before and after holding by chucking. Based on comparison of the power spectrum densities (PSD) before and after the wafer holding by chucking, there may be established three regions, i.e., (1) a region where the PSD strength is decreased by the wafer holding by chucking (for a spatial wavelength of about 20 mm or more), (2) a region where the PSD strength is increased by the wafer holding by chucking (for a spatial wavelength of from about 3 to 20 mm), and (3) a region where the strength does not vary due to the wafer holding by chucking (for a spatial wavelength of about 3 mm or less).

Among these regions, the region (1) corresponds to a region of the so-called warpage component, and it is considered that it was corrected by the holding by chucking. The region (2) corresponds to a region of so-called undulation components, and it is considered that roughness and irregularities of back surface were transferred to the front surface. In the region (3), the back surface roughness was not transferred to the front surface.

Thus, it was confirmed for the first time by the present invention that the influence of back surface roughness and irregularities on the surface profile may vary depending on the spatial wavelength in a quantitative manner.

That is, it is understood that it is the so-called undulation components that cause the problem of back surface profile transfer to the front surface profile, and they correspond to irregularities having a wavelength of around 3–20 mm.

For the frequency analysis, front surface or back surface profile of semiconductor wafer is determined first. This profile determination can be performed by a conventional technique, and any technique can be used so long as it can determine the front surface or back surface profile. For example, the determination may be performed by the contact probe method. However, the inventors of the present invention performed the determination for about 2000 points within a wafer surface by utilizing an optical surface profile analyzer, AutoSort 200 (trade name of Tropel), which measures distance from a detection element to the wafer surface in a non-contact manner.

The frequency analysis is performed by a computer on the data obtained as described above. The data are subjected to filtering process first, and then Fourier transformed to obtain amplitudes, and power spectrum density is finally calculated.

The filtering process is performed in order to extract fundamental periodic components required for the Fourier transformation, and it comprises center line acquisition and transformation of data block defined by utilizing window function.

Fourier transformation enables one to express any kind of periodic function by sum of trigonometric functions. That is, the profile is resolved into sin and cos, and frequencies of sin and cos (spatial frequencies in the case of the present invention) and strength (amplitude) are calculated in accordance with the following equation (1):

$$F(k) = \Sigma Xi \exp(-j2\pi ki/N) \qquad (1)$$

(i=1, ... N, K=0, 1, ... N−1)

In the above equation, F(k) is an amplitude at a wave number k, Xi represents the determined data, and i is a data number. j represents an imaginary number, and real term and imaginary term obtained by the Fourier transformation represent amplitudes of the sin component and the cos component, respectively.

Finally, the power spectrum density is calculated. The spatial frequency and the roughness strength (amplitude) obtained by the Fourier transformation depend on the sampling length. Therefore, when different determination regions are considered, vibration energy per unit length must be obtained in order to quantitatively compare roughness strength (parameter) at a specific spatial frequency. This energy per unit length is called power, and the power spectrum is a plot of the relationship of the spatial frequency and the power. As a method for obtaining a power spectrum, there have been known square operation of directly Fourier transformed function, Fourier transformation of autocorrelation function, AR method and the like. Among these methods, a method utilizing square operation of directly Fourier transformed function is employed for the present invention. Specifically, the power P(k) at each spatial frequency k is obtained in accordance with the following equation (2) by utilizing the Fourier transformed F(k) of the roughness data obtained in accordance with the above equation (1):

$$P(k)=2\pi dF(k)^2/N \qquad (2)$$

In the above equation, d is a sampling length.

Front surface and back surface profiles of wafers exhibiting undulations in magic mirror images like one mentioned in FIG. 3(B) were analyzed by the frequency analysis mentioned above. As a result, the wafers exhibited, for example, undulation components at wavelength of 10 mm of as much as about 20 $\mu$m$^3$ represented in terms of power spectrum density. In this respect, it was found that, if this magnitude was halved or further decreased, the wafer was much improved as for the undulation component. Of course, the undulation components cause problems not only at a wavelength of 10 mm, but in the wavelength range of around 3–20 mm as described above. However, because it is difficult to define its magnitude over the whole range, it was defined at a representative wavelength, i.e., 10 mm. The value at the wavelength of 10 mm well reflects the tendency of the whole undulation components.

Further, the variation of the power spectrum density for the undulation components at a wavelength of from 3 mm to 20 mm of conventional wafers reaches as much as 2.6 to 3.0. This parameter is another expression for the definition of the undulation components as a whole, and given by the following equation: [log(PSD at wavelength of 20 mm)–log (PSD at wavelength of 3 mm)]. As for this variation, it was found that a wafer is much improved as for the undulation components when the value of the variation is 2.0 or less.

The present invention has been accomplished based on these findings and analyses.

That is, if a wafer has undulation components on its back surface represented as 10 $\mu$m$^3$ or less in terms of power spectrum density at least for the components at a wavelength of 10 mm, the back surface profile would not be transferred to the front surface to generate problematic undulations, when the wafer is held on a wafer chuck by chucking, or when the wafer is held at its back surface for polishing of its front surface.

Further, because the transfer of the back surface profile to the front surface can be prevented by the present invention, the power spectrum density of the wafer front surface can be maintained at 10 $\mu$m$^3$ or less, for example, even when the wafer is held on a wafer chuck by vacuum chucking or the like. Therefore, such a wafer does not cause any problem during photolithography and the like in the device-processing steps.

In particular, the power spectrum density of the wafer surface can be reduced to as low as 2 $\mu$m$^3$ or less according to the present invention, and therefore the influence of the undulation component can substantially be eliminated during photolithography and the like.

As for the variation of the power spectrum density, if a wafer has a variation of the power spectrum density of 2.0 or less for the undulation components of wafer front surface and/or back surface at a wavelength of from 3 mm to 20 mm, the back surface profile would not be transferred to the front surface to cause problems upon photolithography and the like.

Further, if a wafer has a variation of the power spectrum density of 2.0 or less for the undulation components at a wavelength of from 3 mm to 20 mm, as well as undulation components at a wavelength of 10 mm of 10 $\mu$m$^3$ or less, the transfer of the back surface profile to the front surface of the wafer can surely be prevented.

While the wafer of the present invention is a wafer of improved characteristic as for the undulation components, it is preferred that it further exhibits wafer warpage of 20 $\mu$m or less.

The warpage component is corrected when it is held by chucking, but the aforementioned warpage range was defined because a smaller warpage can make the undulation component transfer more likely to be prevented, and the wafer front surface less likely to be affected by the holding surface of wafer chuck, when the wafer is held by the same chucking force.

Even though a semiconductor wafer itself is free from the undulation components as described above, if a holding surface of wafer chuck has the undulation components, the irregularities of the holding surface are transferred to the wafer front surface, and cause problems similar to those observed when the wafer has the undulation components. Therefore, it is preferred that the holding surface of wafer chuck also has undulation components at a wavelength of 10 mm of 10 $\mu$m$^3$ or less in terms of power spectrum density.

Figure 4:
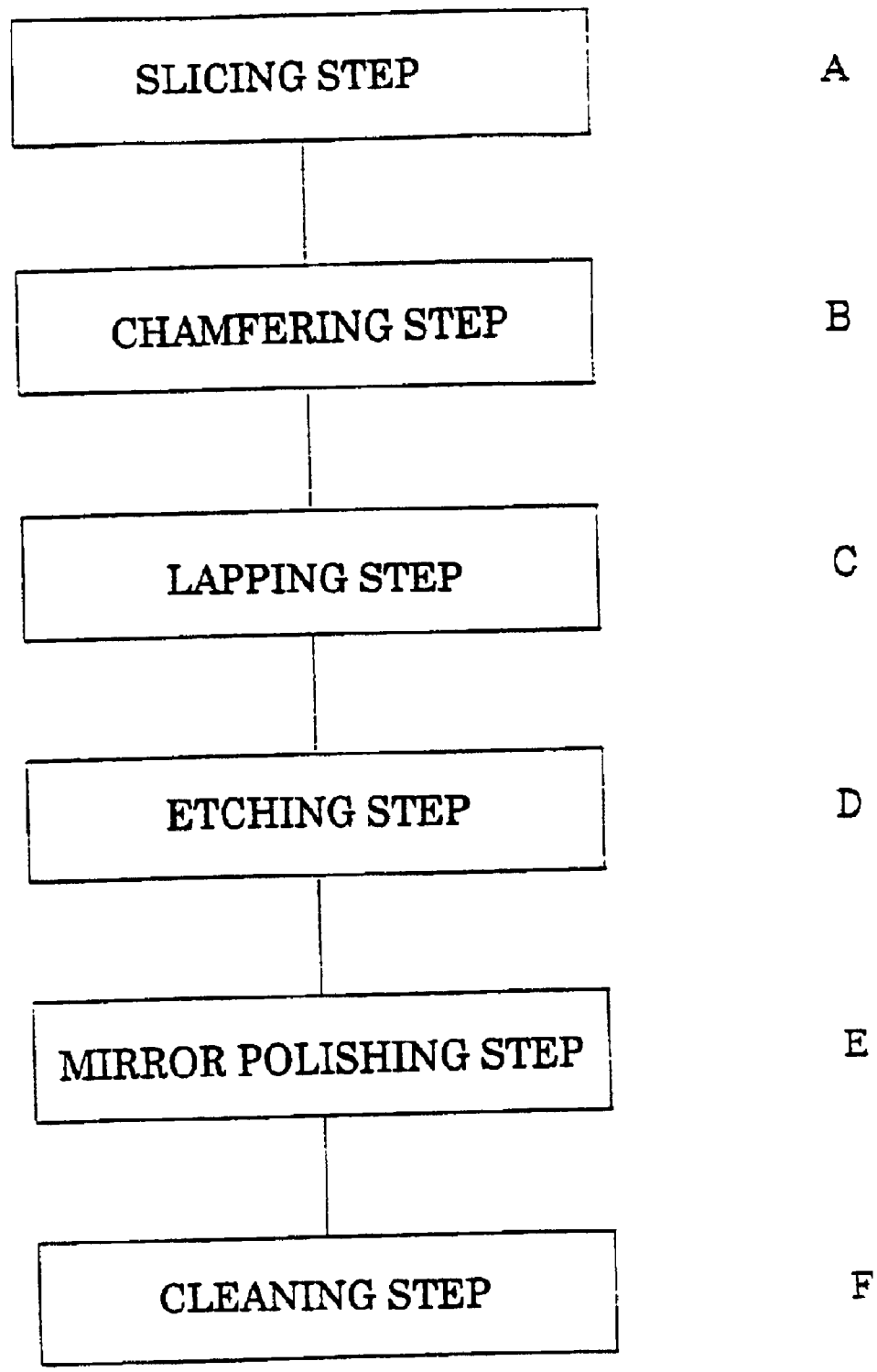
FIG. 4 represents a block diagram of conventional semiconductor wafer production process.

Now, the method for producing a wafer with an improved characteristic as for the undulation components according to the present invention will be explained hereinafter. As explained above, single side mirror polished silicon wafers have conventionally been produced through such a process as shown in FIG. 4. Investigations of the cause of the undulation components observed in silicon wafers produced by such a conventional process as mentioned above revealed that the problem is arisen from the etching step D as explained hereinafter. That is, for the etching step D, the etching is usually performed with a mixed acid of hydrofluoric acid and nitric acid, and the reaction rate of this kind of acid etching is determined by diffusion rate (diffusion controlled reaction). Therefore, it is thought that, when NO gas generated during the etching adheres to the wafer surface, the etching rate may vary due to variation of diffusion rate of the etching solution, and hence undulations are formed on the front surface and the back surface of the wafer.

When the polishing step E was performed for the surface of the wafer having such undulation components while holding the wafer at its back surface, the undulation components of the back surface are transferred to the front surface, and the resulting semiconductor wafer would eventually have undulation components.

Therefore, in order to produce a wafer with few undulation components such as the-wafer according to the present invention, it is expected to prevent the generation of undulations in the etching step D. To this end, for example, alkali etching with KOH, NaOH or the like may be used. It is considered that, because the rate of alkali etching is determined by reaction rate (reaction controlled etching), it shows highly uniform etching rate, and therefore undulations are less likely to be formed on the wafer front surface and back surface.

Alternatively, the aforementioned acid etching may be combined with the alkali etching to reduce the stock removal for the acid etching as far as possible.

Further, after the etching step D by the acid etching or the alkali etching, the side to be held (back surface) may be polished by a thickness of, for example, around 1 $\mu$m to remove undulation components before the holding and polishing of the front surface. Alternatively, a wafer may be held between upper and lower turn tables without holding the wafer to polish the front and back surfaces simultaneously.

The semiconductor wafer of the present invention can be obtained as described above, but the production method is not limited to these methods. That is, the method may be any method for producing a semiconductor wafer by polishing a front surface of the semiconductor wafer which is held on its back surface, so long as it utilizes a semiconductor wafer to be polished having undulation components at a wavelength of 10 mm of 10 $\mu m^3$ or less in terms of power spectrum density for the wafer back surface. In such a method, the undulations are not transferred to the front surface because the back surface to be held does not have undulations, and thus a semiconductor wafer having a good surface profile can be produced.

In this case, because it is likely that the undulations on the wafer are generated during the etching step, the back surface profile of wafers after the etching can be determined and analyzed by the frequency analysis, and only those wafers having undulation components within the range defined by the present invention can be used for the polishing step to surely obtain wafers according to the present invention.

EXAMPLES

The present invention will be specifically explained hereinafter with reference to the following examples and comparative example, but the present invention is not limited to these.

Examples and Comparative Example

Wafers of various back surface conditions were produced, and their back surface profiles were determined by using the aforementioned AutoSort 200. Then, power spectrum densities were obtained through frequency analysis performed in the manner described above.

The wafers whose profiles were determined were each produced under the following conditions.

① Wafer Produced by Acid Etching (Conventional Wafer)

In the etching step, a thickness of 30 $\mu m$ in total was etched off from both sides of the wafer with a mixed acid of hydrofluoric acid and nitric acid. Then, the wafer was held at its back surface, and its front surface was removed by a thickness of around 8 $\mu m$ by polishing.

② Wafer Produced by Alkali Etching

In the etching step, a thickness of 30 $\mu m$ in total was etched off from both sides of the wafer with NaOH. Then, the wafer was held at its back surface, and its front surface was removed by a thickness of around 8 $\mu m$ by polishing.

③ Wafer Produced by Alkali Etching and Acid Etching

In the etching step, a thickness of 20 $\mu m$ in total was etched off from both sides of the wafer with NaOH first, and then a thickness of 10 $\mu m$ in total was etched off from both sides of the wafer with a mixed acid of hydrofluoric acid and nitric acid. Then, the wafer was held at its back surface, and its front surface was removed by a thickness of around 8 $\mu m$ by polishing.

④ Wafer Produced by Alkali Etching and Polishing of Back Surface

In the etching step, a thickness of 30 $\mu m$ in total was etched off from both sides of the wafer with NaOH. Then, after the back surface was polished by a thickness of around 1 $\mu m$, the wafer was held at its back surface, and its front surface was removed by a thickness of around 8 $\mu m$ by polishing.

⑤ Wafer Produced by Acid Etching and Double Side Polishing

In the etching step, a thickness of 30 $\mu m$ in total was etched off from both sides of the wafer with a mixed acid of hydrofluoric acid and nitric acid. Then, both sides of the wafer were removed by a thickness of around 10 $\mu m$ by polishing.

Figure 2:
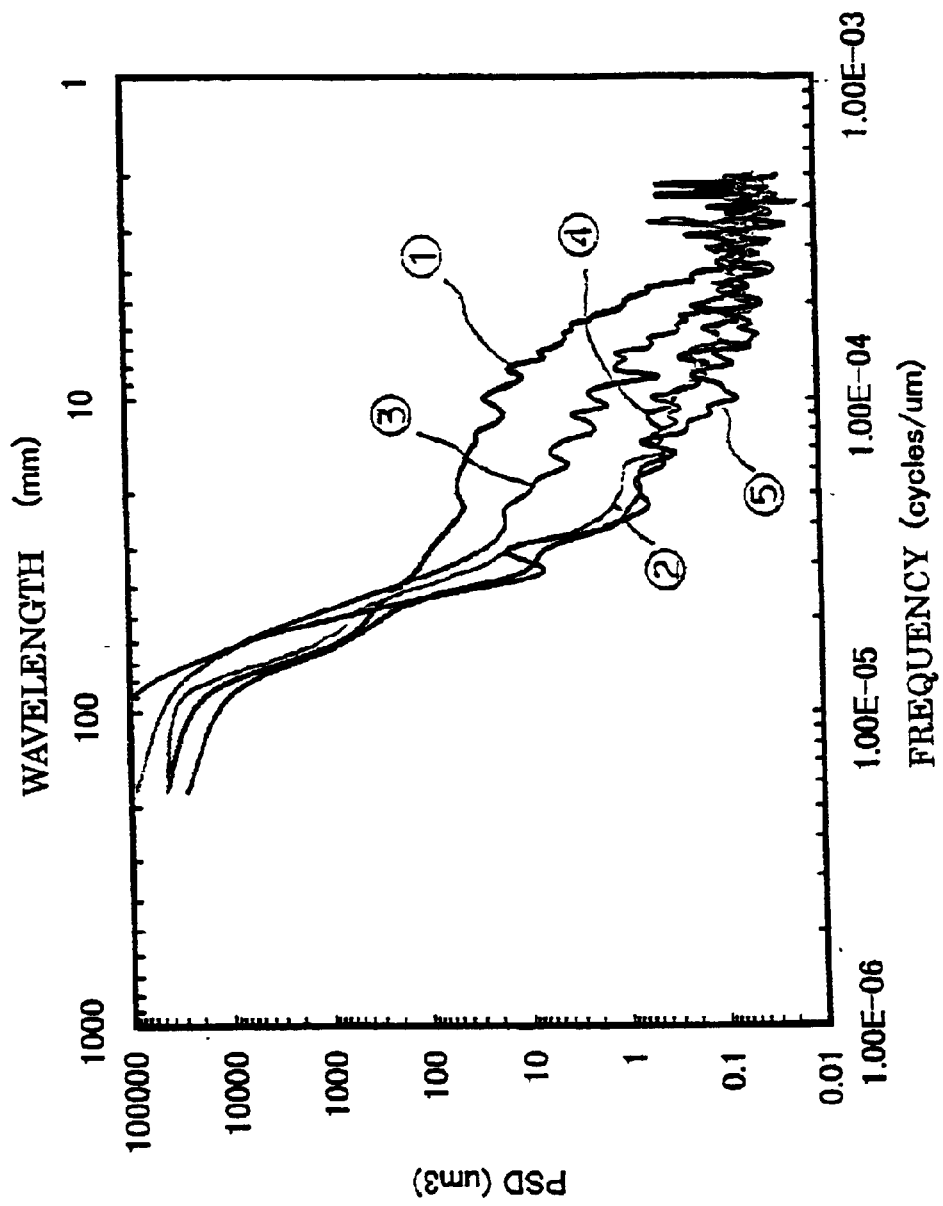
FIG. 2 represents results of Examples and Comparative Example.

The obtained results are shown in FIG. 2.

From the results shown in this figure, it can be seen that the conventional wafer ① produced by acid etching had undulation components at a wavelength of 10 mm represented in terms of power spectrum density of as much as about 20 $\mu m^3$, whereas the wafers subjected to the processes for reducing the back surface undulations ② to ⑤ exhibited power spectrum densities of 10 $m^3$ or less.

Then, the variation of the power spectrum density for undulation components at a wavelength of from 3 mm to 20 mm [log(PSD at wavelength of 20 mm)–log(PSD at wavelength of 3 mm)] was obtained for each wafer from the figure. The results are as follows.

1.60−(−1.15)=2.75  ①

−0.13−(−1.15)=1.02  ②

0.85−(−1.15)=2.00  ③

−0.15−(−1.15)=1.00  ④

−0.15−(−1.15)=1.00  ⑤

Thus, the variation of power spectrum density for undulation components at a wavelength of from 3 mm to 20 mm was markedly reduced in the wafers of the present invention compared with the conventional wafer, and it was 2.0 or less for all of the wafers of the present invention.

Then, each of the wafers ①, ②, ④ and ⑤ was held by vacuum chucking at its back surface on a wafer chuck whose holding surface had undulation components at a wavelength of 10 mm of 0.2 $\mu m$ in terms of power spectrum density, and a magic mirror image of each wafer front surface in that state was examined. FIGS. 3(B) to (E) represent the results of the examination.

From these images, it can be seen that undulations were observed over the entire surface of the conventional wafer ① (see FIG. 3(B)), whereas undulation components were markedly improved on the surfaces of the other wafers (see FIGS. 3(C) to (E)).

The present invention is not limited to the embodiments described above. The above-described embodiments are mere examples, and ones having the substantially same structure as that described in the appended claims and providing the similar functions and advantages are included in the scope of the present invention.

For example, diameter of the semiconductor wafer according to the present invention is not particularly limited. The present invention may be similarly applied to recently used large diameter semiconductor wafers having a diameter of 200 mm or more, or 300 mm or more, as well as wafers having a diameter of 150 mm or less.

While the present invention defines the undulation components as undulation components of 10 $\mu m^3$ in terms of power spectrum density at least for the components at a wavelength of 10 mm, the improvement is not limited to undulation components at a wavelength of 10 mm, and the wafer of the present invention includes wafers whose undulation components within a wavelength range of 3–20 mm are improved.

Further, while the aforementioned embodiments were explained by exemplifying silicon wafers as the semiconductor wafer, the present invention is not limited to these, and can be similarly applied to compound semiconductor wafers of GaAs, GaP, InP and the like and other semiconductor wafers, which may suffer from the problem during the photolithography step or the like caused by the undulation components.

Because the wafer chuck of the present invention is characterized by the reduced undulation components of the holding surface, mechanism, shape and the like of the wafer chuck are not particularly limited. That is, the wafer chuck may be based on chucking by vacuum suction, electrostatic chucking, and other mechanisms.

Figure 5:
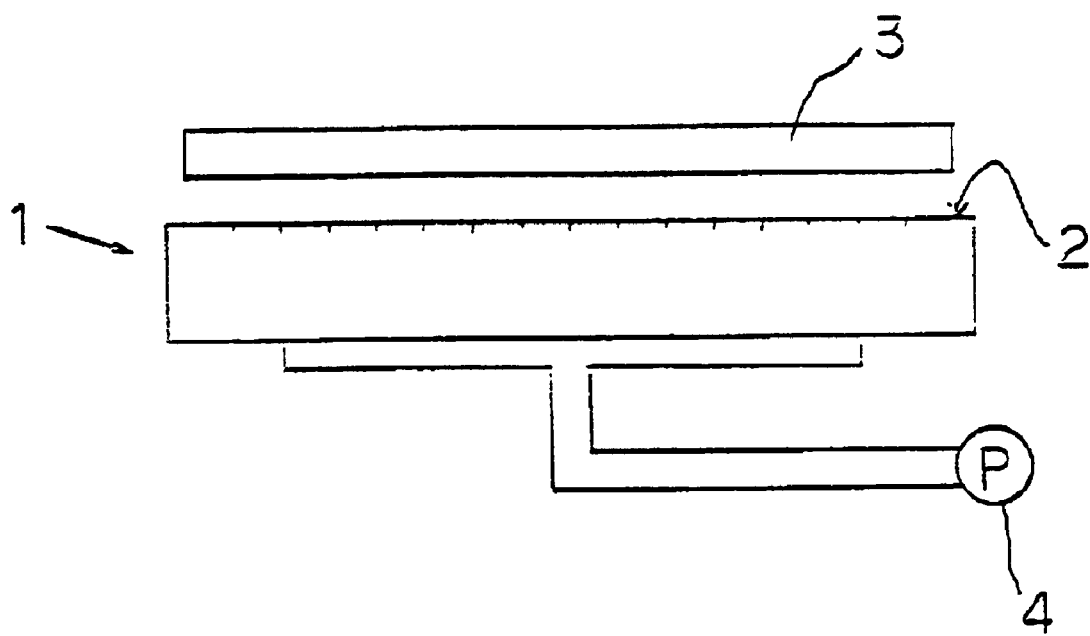
FIG. 5 represents an exemplary structure of wafer chuck of the present invention.

For example, an exemplary wafer chuck according to the present invention is shown in FIG. 5. The wafer chuck 1 is for holding a semiconductor wafer 3 on a holding surface 2 by vacuum suction, and provided with a plurality of holes on the holding surface 2. The wafer is held by suction through the holes by means of a pump 4. The holding surface 2 may have, as its definition of flatness, undulation components at a wavelength of 10 mm of 10 $\mu m^3$ or less in terms of power spectrum density according to the present invention.

What is claimed is:

1. A method for producing a semiconductor wafer by polishing a surface of the semiconductor wafer which is held at its back surface, which determines a back surface profile and analyzes its frequency to calculate its power spectrum density at least before holding the semiconductor wafer, and polishes only a semiconductor wafer having undulation components on wafer back surface of 10 $\mu m^3$ or less represented in terms of power spectrum density at least for the components at a wavelength of 10 mm and/or a variation of power spectrum density of 2.0 or less for undulation components at a wavelength of from 3 mm to 20 mm of the wafer back surface.

2. The method for producing a semiconductor wafer according to claim 1, which utilizes a semiconductor wafer having wafer warpage of 20 $\mu m$ or less.

3. The method for producing a semiconductor wafer according to claim 1 which utilizes a silicon semiconductor wafer.

4. The method for producing a semiconductor wafer according to claim 2 which utilizes a silicon semiconductor wafer.

* * * * *